United States Patent [19]

Miyaguchi et al.

[11] Patent Number: 5,508,740

[45] Date of Patent: Apr. 16, 1996

[54] SOLID-STATE IMAGING DEVICE HAVING TEMPERATURE SENSOR

[75] Inventors: Kazuhisa Miyaguchi; Tetsuhiko Muraki, both of Hamamatsu, Japan

[73] Assignee: Hamamatsu Photonics K.K., Hamamatsu, Japan

[21] Appl. No.: 278,234

[22] Filed: Jul. 21, 1994

[30] Foreign Application Priority Data

Jul. 23, 1993 [JP] Japan .................................. 5-182764

[51] Int. Cl.$^6$ ................................ H04N 9/64; H04N 5/335
[52] U.S. Cl. ............................ 348/244; 348/207; 348/294
[58] Field of Search ............................ 348/207, 244, 348/241, 243, 294; 250/208.1; 62/3.3, 3.2, 3; H04N 5/335

[56] References Cited

U.S. PATENT DOCUMENTS

| | | | |
|---|---|---|---|
| 4,402,185 | 9/1983 | Perchak | 62/3 |
| 4,551,760 | 11/1985 | Bendell | 348/294 |
| 4,594,613 | 6/1986 | Shinbori et al. | 348/207 |
| 4,739,409 | 4/1988 | Baumeister | 348/297 |
| 5,272,535 | 12/1993 | Elabd | 348/317 |

Primary Examiner—Michael T. Razavi
Assistant Examiner—Tuan V. Ho
Attorney, Agent, or Firm—Cushman Darby & Cushman

[57] ABSTRACT

The solid state image sensor comprises a chip in a package. A image sensor is formed in the chip. The package has a package main body, a light receiving glass plate fixed to the package main body, and a buffer member arranged between the package main body and light receiving glass plate. The buffer member is fixed to the light receiving glass plate and to the package main body. The thermal expansion coefficient of the buffer member is substantially equal to that of the light receiving glass plate, so that the light receiving plate is fixed to the package main body even though the temperature of the imaging device changes. Therefore, the adhesion between the package main body and the light receiving glass plate and the airtightness in the package are maintained.

2 Claims, 6 Drawing Sheets

SOLID-STATE IMAGING DEVICE HAVING TEMPERATURE SENSOR

BACKGROUND OF THE INVENTION

1. Field of the Invention

The present invention relates to a solid state imaging device (solid-state image pickup device), which comprises a solid state image sensor such as CCD (Charge Coupled Device, charge-coupled image sensor) formed therein.

2. Related Background Art

Solid state imaging device which comprises a solid state image sensor such as CCD image sensors and MOS image sensors are devices for photoelectrically converting light incident on these image sensors. The solid state image sensor has two-dimensionally arranged pixels on its surface. The light incident on the solid state image sensor is converted into a signal charge with the image sensor. The solid state image sensor has electrodes formed in correspondence with the pixels. A drive voltage is applied to the electrodes so that a charge corresponding to incident light is stored and transferred. The signal charge (video signals) generated by each pixel corresponds to an image of light radiated on the solid state image sensor of the solid state imaging device. More precisely, CCD, which is the solid state image sensor, is a device wherein minority charge is stored in a spatially defined depletion region (potential well) at the surface of a semiconductor and is moved about the surface by transferring this charge to similar adjacent wells. A solid-state imaging device is described in Japanese Patent Laid-Open No. 2-44872.

SUMMARY OF THE INVENTION

A cooled solid state imaging device according to present invention performs photodetection with a high S/N ratio by cooling a solid state image sensor chip in a package.

The solid state imaging device comprises a solid state image sensor chip, and the solid state image sensor chip include a solid state image sensor such as CCD and first temperature sensor formed in the image sensor chip.

The solid state imaging device of the present invention is compact and suitable for measurement such as spectrum analysis. According to the present invention, there is provided a cooled solid state imaging device which incorporates a solid state image sensor chip and an electronic cooling element (such as Peltier device) for cooling the solid state image sensor (chip) in a package.

The solid state imaging device comprises a package, a solid state image sensor chip having a solid state image sensor and first temperature sensor formed therein, a cooling element, a heat radiation member, and a second temperature sensor.

The package has a package main body, a light receiving glass plate (glass window) fixed to the package main body, and a buffer member arranged between the package main body and light receiving glass plate. The buffer member is fixed to the light receiving glass plate and to the package main body. The thermal expansion coefficient of the buffer member is substantially equal to that of the light receiving glass plate, so that the light receiving plate is fixed to the package main body even though the temperature of the imaging device changes. In other words, the buffer member has a thermal expansion coefficient equal to that of said light receiving glass plate such that said member is not peeled from said light receiving glass plate by a temperature in said package. Therefore, the adhesion between the package main body and the light receiving glass plate and the airtightness in the package are maintained.

The solid state image sensor chip is arranged in the package. The solid state image sensor chip has a solid state image sensor such as CCD and first temperature sensor formed therein. The image sensor chip comprises a semiconductor substrate, and the solid state image sensor and first temperature sensor is formed in the substrate. The first temperature sensor can be constructed by a p-n junction diode or a field effect transistor formed in the semiconductor substrate. Further, the solid state imaging device may comprise a means for performing temperature indication from a forward current of the p-n junction diode or a drain current of the field effect transistor.

The electronic cooling element is arranged in the package to cool the solid state image sensor chip. The electronic cooling element such as Peltier device has a cool portion and hot portion. The cool portion is faced to and in contact with the solid state image sensor chip.

The heat radiation member is fixed to the hot portion of the electronic cooling element, and is in contact with the package main body. The heat radiation member has a good thermal conductivity, and radiates heat from the electronic cooling element to outer circumstance. Heat conducts from the heat radiation member to the package main body and the light receiving glass plate. Since the package according to the invention comprises a buffer member fixed to the light receiving glass plate and to the package main body, the glass plate does not come off from the package main body with the temperature change caused by the heat transfer above mentioned.

The second temperature sensor is arranged in the package and formed on the heat radiation member to detect the temperature of the heat radiation member. The second temperature sensor can be a thermocouple or a p-n junction diode.

Further, the solid state imaging device comprises a temperature control circuit electrically connected to the electronic cooling element. The temperature control circuit controls the amount of electric current fed to the electronic cooling element, so that the temperature of the electronic cooling element is controlled with the temperature control circuit. At the same time, by feeding back the detection output from the first temperature sensor to the temperature control circuit for the electronic cooling element, the solid state image sensor chip can be controlled to be cooled with the electronic cooling element to keep the set temperature.

According to the present invention, the solid state image sensor chip temperature of the solid state imaging device can be indicated by a detection output from one sensor or a plurality of temperature sensors formed on the same chip. Heat generated by the solid state image sensor chip is radiated by the electronic cooling element. Since heat from the electronic cooling element is radiated by a heat radiation member having a good thermal conductivity, thermal runaway of the electronic cooling element and of the solid state image sensor can be prevented. Even if the thermal runaway of the solid state imaging sensor and first temperature sensor formed in the chip was caused, the second temperature sensor formed on the heat radiation member can detect the temperature of the solid state image sensor chip indirectly to protect the electronic cooling element, solid state image sensor or the package of present imaging device.

In addition, even when a thermal stress caused by a temperature cycle is applied to the entire device, airtightness can be maintained because the light receiving glass plate of the package is welded with a frame material (buffer member) of the package having almost the same thermal expansion coefficient as that of glass. Therefore, satisfactory measurement can be performed.

As described above, with the simple arrangement of the entire device including indication of the cooling temperature, an inexpensive and compact measurement image sensor suitable for spectrum analysis and allowing relatively long-time exposure can be provided.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENT

An embodiment of the present invention will be described with reference to the accompanying drawings. The same description as that of the prior art will be simplified or omitted.

Figure 1:
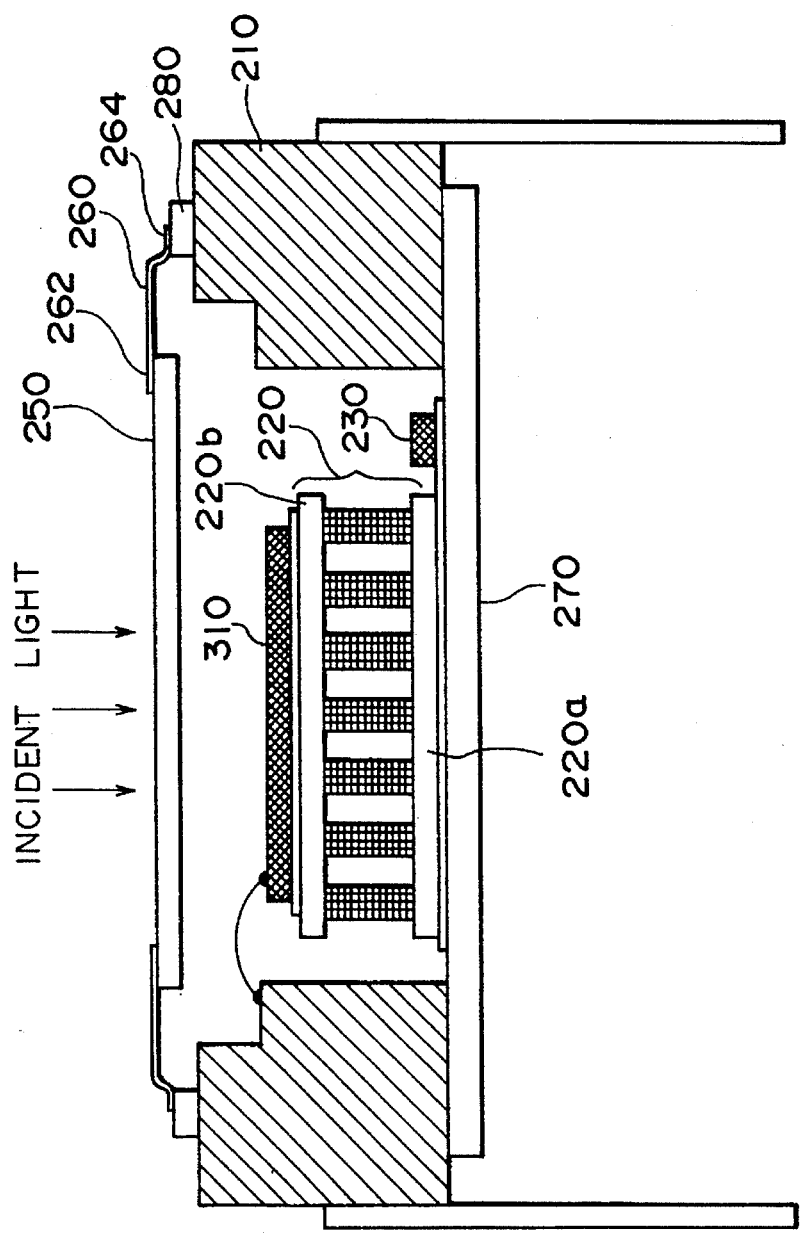
FIG. 1 is a longitudinal sectional view showing a solid-state image pickup device of the present invention.

FIG. 1 is a sectional view showing the arrangement of a solid state imaging device of the present invention.

The solid state imaging device comprises a package, a solid state image sensor chip 310 having a solid state image sensor and first temperature sensor formed therein, a cooling element 220, a heat radiation member 270, and a second temperature sensor 230.

The package comprises a package main body 210, a buffer member 260, and light receiving glass plate 250.

A heat radiation member 270 made of copper tungsten (CuW) is provided on the bottom portion of a ceramic package (package main body) 210 to satisfactorily radiate internally generated heat. An incident window (light-receiving surface glass plate) 250 of Kovar glass is provided on the incident side of incident light. This incident window 250 is mounted on a frame 280 of the package 210 by a frame member (buffer member) 260 of Kovar (fernico). The incident window 250 and the frame member 260, and the frame member 260 and the frame 280 are fixed to each other at welded portions 262 and 264, respectively, to seal the package 210. A sealed space is defined by the package main body 210, the buffer member 260, the light receiving glass plate (light transmission plate) 250 and the heat radiation member 270.

The package 210 incorporates the electronic cooling element (Peltier element or device) 220. The second temperature sensor (thermistor) 230 is provided on a hot portion 220a of the Peltier element 220. When thermal runaway occurs in the Peltier element 220, the thermistor 230 forcibly stops applying a power supply voltage to the Peltier element at a set temperature or more. The thermistor 230 is used to prevent the Peltier element 220 from destruction caused by its thermal runaway. For illustrative convenience, wires of the wire bonding of the thermistor 230 on the hot side, the power supply terminal of the Peltier element 220, and the like are omitted.

The solid state image sensor chip (CCD chip) 310 is mounted on a cold portion 220b of the Peltier element 220. With this arrangement, the CCD chip 310 is cooled, and heat is radiated through the package 210.

Figure 2:
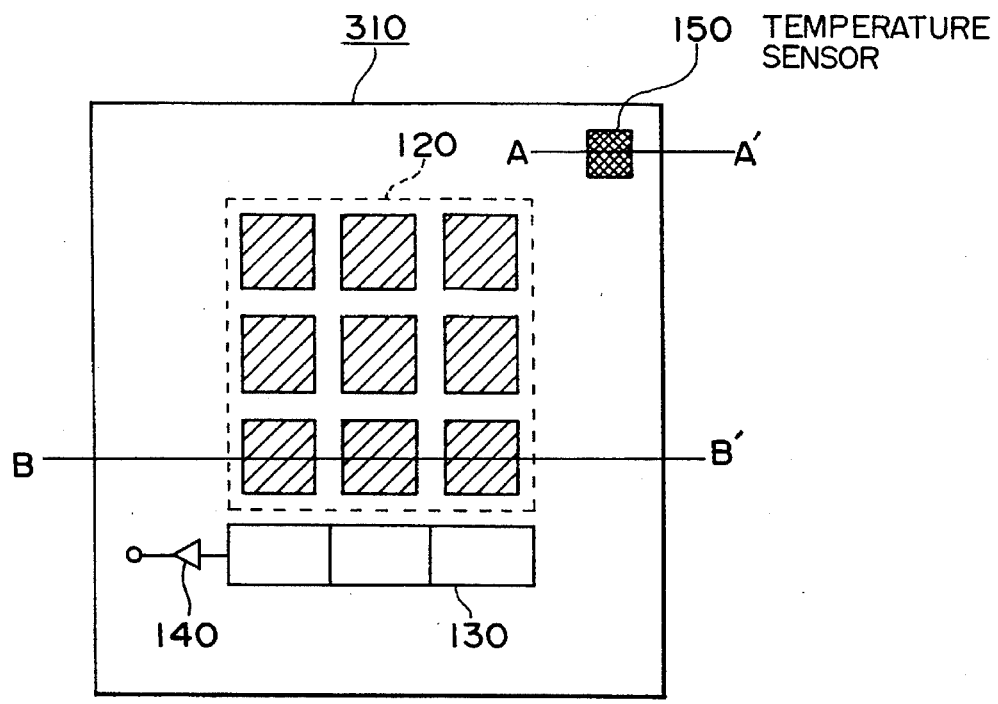
FIG. 2 is a plan view showing the outer shape of a CCD chip.

FIG. 2 is a plan view showing the outer shape of the CCD chip (semiconductor substrate) 310. A p-n junction diode 150 is formed in a first region of the semiconductor chip 310. This diode 150 is used as a first temperature sensor for monitoring the temperature of the chip 310. The diode 150 is formed by doping an n-type impurity such as phosphorus or arsenic in a p-type epitaxial layer 112 in the CCD chip 310.

Figure 3:
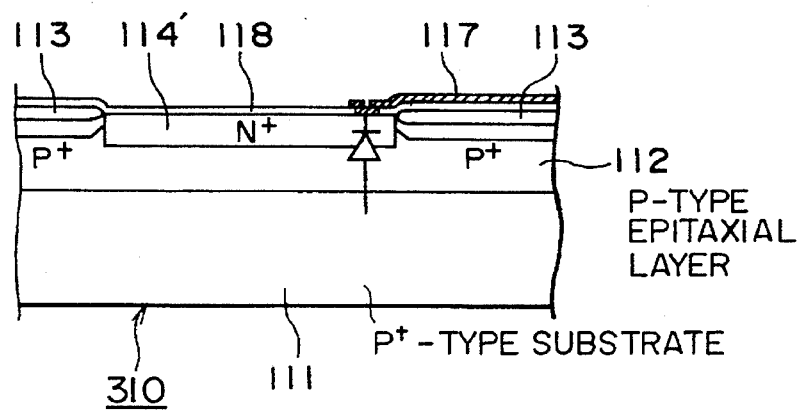
FIG. 3 is a sectional view showing a temperature sensor taken along a ling A—A.

FIG. 3 is a sectional view taken along a line A—A' in FIG. 2. The diode 150 is formed by the $p^+$-type epitaxial layer 112 and an $n^+$-type layer 114'. An aluminum wiring layer is connected to the $n^+$-type layer 114' through an opening formed in an oxide film 118. When a constant forward current is supplied to the diode 150, a temperature can be detected from a forward voltage generated across the diode. Therefore, a function of indicating the temperature of the CCD chip 310 can be realized by a temperature indication circuit (to be described later).

In FIG. 2, an arrangement of an n-channel full frame transfer (FFT) type CCD image sensor (120, 130, 140) is shown. The image sensor (120, 130, 140) is formed in a second region of the chip 310. The image sensor (120, 130, 140) is constituted by a frame portion 120, a horizontal transfer portion 130, an output portion 140. The frame portion 120 is constituted by a plurality of arrays of CCD each serving as a pixel. Light incident on the frame portion 120 is photoelectrically converted. The photoelectrically converted signal charge is transferred to the horizontal transfer portion 130 upon application of a drive voltage to the frame portion 120. The signal charge transferred to the horizontal transfer portion 130 is sequentially transferred to the output portion 140 for each line. The output portion 140 is constituted by a floating diffusion amplifier (FDA) 140 and converts the received signal charge into a voltage and outputs the voltage signal (video signal). The outputs is a video signal corresponding to the incident light.

This FFT type CCD image sensor is used in combination with a mechanical shutter (not shown) or ON/OFF-controlled light source (neither are shown). In a first period from time $t_1$ to time $t_2$ (sec), light is illuminated on the chip 310. In a second period of time subsequent to the first period of time, no light is illuminated on the chip 310. In this second period of time, the shutter is closed. In the second period of time, the signal charge is extracted from the output portion 140. That is, this CCD is used such that no light is illuminated on the sensor in the read time of the signal charge.

Figure 4:
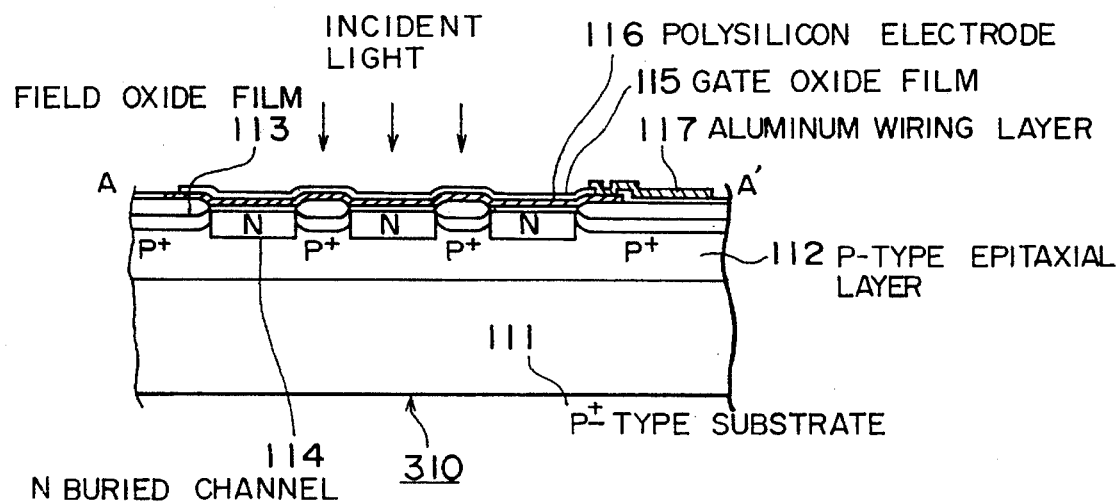
FIG. 4 is a sectional view showing a frame portion taken along a ling B—B'.

FIG. 4 is a sectional view showing the structure of the chip 310 taken along a line B—B' in FIG. 2.

At the time of manufacturing the chip 310, a wafer having the p-type epitaxial layer 112 grown on a p$^+$-type substrate 111 is used. Using the LOCOS (Local Oxidation of Silicon) method, a field oxide film (insulator layer) 13 (element isolation region) is formed on the surface portion of the epitaxial layer 112. Thereafter, phosphorus or arsenic ion is implanted in the epitaxial layer 112 to form an n-type buried channel 114. After a gate oxide film 115 and a transfer polysilicon (poly-Si) electrode 116 are formed, a contact hole for extracting the electrode and an aluminum wiring layer 117 is formed, as shown in FIG. 4.

The FFT type CCD image sensor (120, 130, 140) is mainly used for measurement such as spectrum analysis. The detection limit of the CCD image sensor largely depends on read noise and shot noise caused due to a dark current. At room temperature, the detection limit of the image sensor is determined by shot noise caused due to the dark current, so the performance of the CCD is not effectively used. To decrease the shot noise caused due to the dark current such that the detection limit of the CCD image sensor is determined by the read noise, the chip 310 is cooled with the electronic cooling element 220.

Next, an example of indication of a chip temperature using an output from the p-n junction diode 150 formed in the CCD chip 310 will be described below in detail.

Figure 5:
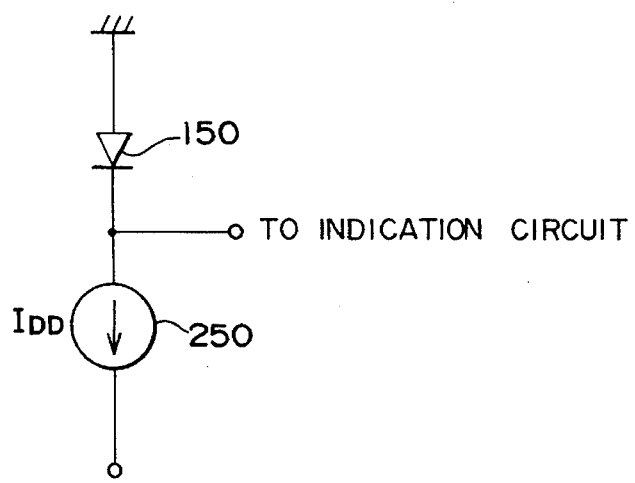
FIG. 5 is a circuit diagram of a circuit for detecting a forward voltage of a diode.

FIG. 5 is a circuit diagram showing a circuit for flowing a predetermined forward current by a constant current source 250 which is equivalent to the diode 150 to detect the forward voltage of the diode 150. In this circuit, the p-side (anode) terminal of the p-n junction diode 150 is the silicon substrate 111 set to the ground level. The constant current source 250 is connected to the n-side (cathode) terminal and is connected to a circuit (410 thru 450, shown in the FIG. 6) to monitor the potential at the n-side terminal of the diode 150.

As the basic characteristic of the p-n junction diode, it is commonly known that the temperature coefficient of a forward voltage of the diode 150 is about −2 mV/°C. when the diode current is constant. Every time the temperature decreases by 1° C., the forward voltage of the diode 150 increases by about 2 mV. Using this characteristic, the temperature of the CCD chip 310 can be measured by the circuit (410 thru 450) for monitoring the forward voltage of the diode 150.

Figure 6:
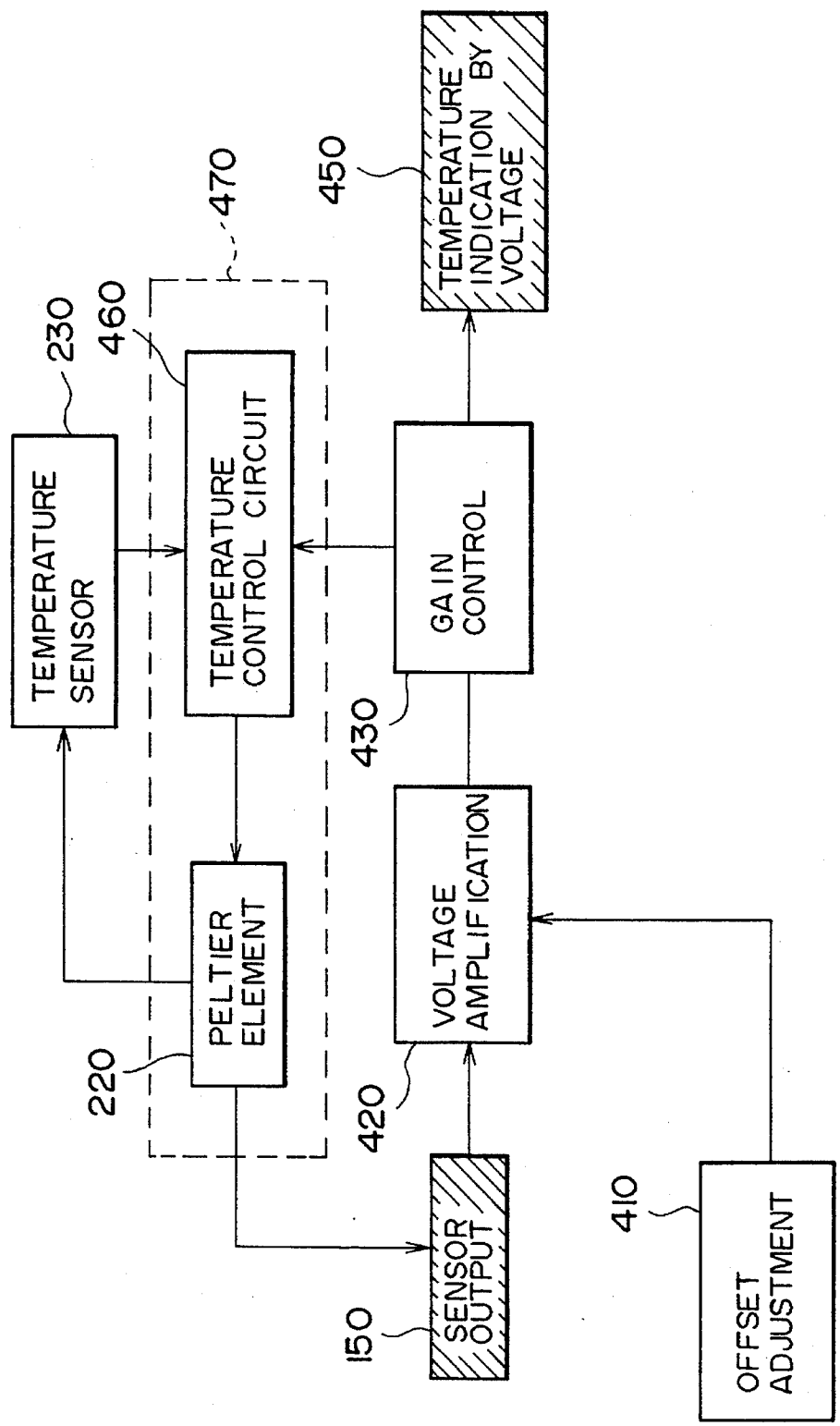
FIG. 6 is a view showing the arrangement of a circuit for performing easy indication of a temperature.

FIG. 6 is a block diagram showing the arrangement of a circuit (410 thru 450) for performing easy temperature indication from the forward voltage of the diode 150. In this circuit, a difference between a voltage from an offset adjustment circuit 410 such as a variable resistor and an output from the sensor 150 is amplified by a voltage amplification circuit 420 constituted by an OP amplifier. The amplified voltage is adjusted by a gain control circuit 430 such as a variable resistor, thereby indicating the voltage by a voltmeter 450 or the like.

In FIG. 6, cooling system 470 and second temperature sensor 230 are also illustrated. The cooling system 470 comprises the cooling element (Peltier element) 220 and temperature control circuit 460. The temperature control circuit 460 controls the amount of current fed to the Peltier element 220, and the temperature of the Peltier element 220 is controlled with the temperature control circuit 460. The temperature control circuit is constituted by an OP amplifier. The Peltier element 220 cools the chip 310, so that the first temperature sensor diode 150 is cooled with the Peltier element 220 being in contact with the chip 310. Therefore, when the temperature of the chip 310 measured with the diode 150 changes, the detection output from the diode 150 is applied to the cooling system 470 and temperature control circuit 460 controls the Peltier element 220 maintaining desired temperature of the chip 310. These elements (150, 410, 420, 430, 470) form a feed back loop. The temperature of the hot portion 220a of the Peltier element 220 is measured with the second temperature sensor 230 indirectly. When the temperature of the hot portion 220a is increased to an undesired value, the temperature control circuit 460 cuts off current fed to the Peltier element 220.

Figure 7:
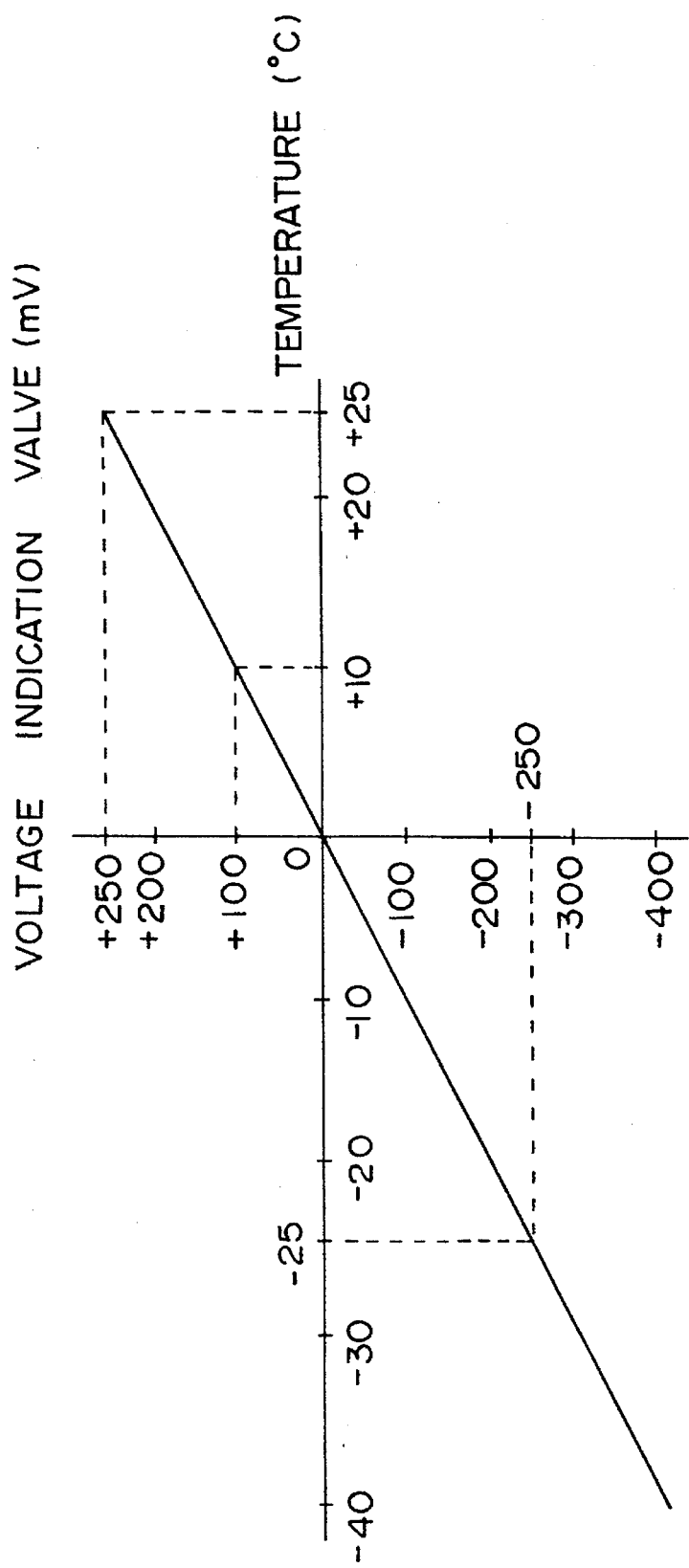
FIG. 7 is a graph showing the relationship between a measurement temperature and a voltage indication value.

FIG. 7 is a graph showing the relationship between a measurement temperature of the chip 310 and a voltage indication value as an example of temperature indication using this circuit. In this case, the temperature of the CCD chip 310 is monitored at a temperature of −40° C. to 25° C. At a temperature of −40° C. to 25° C., the forward voltage of the diode almost linearly changes. Therefore, using a measurement temperature t (°C.) and a voltage indication value V (mV), the relationship is represented by "$t = \alpha \times V$ (where $\alpha$ is a coefficient)". When the coefficient $\alpha$ is set to an appropriate value, the measurement temperature of the chip 310 is indicated in voltage.

After offset adjustment is performed with the offset adjustment circuit 410 shown in FIG. 6 to amplify the voltage to some extent in advance such that the output at 0° C. becomes 0 V, gain control is performed with the gain control circuit 430 such that the output at +25° C. becomes 250 mV. The coefficient $\alpha$ is set to 0.1, thereby matching the scale of the temperature with that of the voltmeter. If the voltage indication value is 100 mV, the temperature is found to be 10° C. If the voltage indication value is −250 mV, the temperature is found to be −25° C. Therefore, very easy indication can be performed. When a voltmeter 450 having a different scale is used, setting is changed in accordance with the scale.

The forward voltage of the p-n junction diode 150 formed in the CCD chip 310 can be used to indicate the temperature of the CCD chip 310. At the same time, the forward voltage is fed back to the temperature control circuit 460 of the Peltier element 220 to keep the set temperature.

In use of this solid state imaging device, the temperature is indicated as described above, and a predetermined temperature is kept. In this case, to dissipate heat generated by the CCD chip 310, control is performed to flow a larger current to the Peltier element 220. If the generated heat is not sufficiently radiated, the Peltier element 220 itself generates heat by the current flowing therein to be subjected to thermal runaway. However, in this solid state imaging device, the heat radiation member 270 of CuW having a good thermal conductivity promotes thermal radiation, thereby preventing the thermal runaway. Even when the thermal runaway is caused, the thermistor 230 detects it to protect the device.

In addition, in the used and unused states, a temperature cycle is generated, and a thermal stress caused due to this cycle is applied to the entire device. If the incident window 250 is sealed with a resin, this thermal stress may damage the airtightness. The package main body 210 and the glass window 250 are heated by heat transfer from the heat radiation member 270 or by other cause. However, in this solid state imaging device, the incident window 250 is welded with Kovar having almost the same thermal expansion coefficient as that of glass. For this reason, the influence of the thermal stress occurred between the window 250 and body 210 can be suppressed, and the airtightness of the package can be maintained, thereby performing satisfactory measurement. As described above, with the simple arrangement of the entire device including indication of the cooling temperature, an inexpensive and compact measurement image sensor suitable for spectrum analysis and allowing relatively long-time exposure can be provided.

Figure 8:
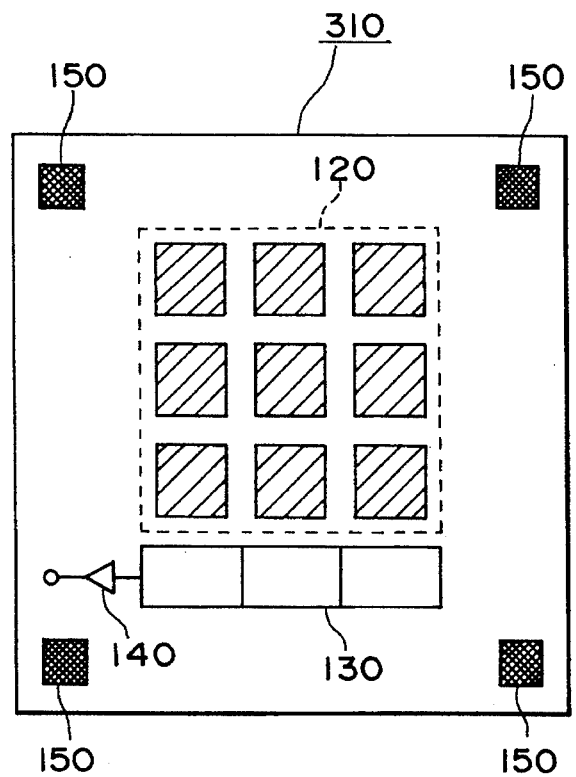
FIG. 8 is a plan view showing the outer shape of the CCD chip when a plurality of temperature sensors are formed thereon.

The above embodiment has exemplified that first temperature sensor 150 such as a p-n junction diode or a FET is used for temperature indication. As shown in FIG. 8, a plurality of temperature sensors 150 may be formed in the CCD chip 310. With this arrangement, temperature detection of the CCD chip 310 can be performed with high accuracy because the temperature of the chip 310 is measured at plurality point or region with the plurality temperature sensors 150. For example, in FIG. 8, when an average of outputs from the four temperature sensors 150 in the chip 310 is obtained, temperature indication can be performed with high accuracy.

The present invention is not limited to the above embodiment, and various changes and modifications can be made.

Figure 9:
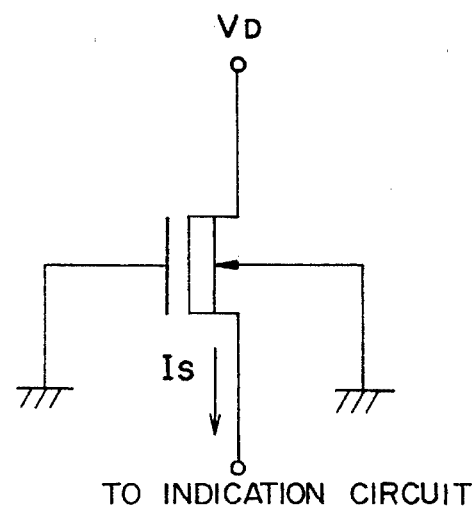
FIG. 9 is a circuit diagram showing a circuit for detecting a source current $I_S$.

In the above embodiment, the p-n junction diode is used for temperature detection. However, in place of the p-n junction diode, a field effect transistor (FET) may be formed in the CCD chip 310 and used for temperature detection. For example, when an n-channel depletion type FET is formed, the temperature of the CCD chip can be monitored using the temperature characteristic of the source current $I_S$. In this case, the source current $I_S$ is detected by a circuit as shown in FIG. 9. While matching the scales, indication can be performed by a circuit having an I-V conversion/voltage amplification circuit in place of the voltage amplification circuit 420 in FIG. 6. In FIG. 9, the gate of the FET is set to the ground potential. However, the gate may be set to a predetermined potential such as a power supply voltage.

The above embodiment has exemplified the n-channel CCD as the CCD chip 310. However, a p-channel CCD can also be used. The type of the CCD wafer 111 is not limited to the p/p$^+$-type, either. As a matter of course, the polarity of the p-n junction diode or FET used as a temperature sensor, or a bias must be set in accordance with a temperature sensor and a wafer used.

The type of the CCD image sensor (120, 130, 140) is not limited to the FFT type, either. An interline transfer (IT) type, frame transfer (FT) type, or frame interline transfer (FIT) type sensor can also be used to obtain the same effect as described above.

As has been described above, according to the present invention, the chip temperature of the solid state image sensor (120, 130, 140) formed in the chip 310 is indicated by the temperature detection element 150, and thermal runaway of the image sensor (120, 130, 140) or the diode 150 is prevented by the heat radiation member 270 to protect the device. At the same time, the glass window 250 of the package and the frame 280 of the package main body 210 are welded to each other with a material 260 having substantially same thermal expansion coefficient as that of the glass window 250, thereby suppressing the influence of a thermal stress due to a temperature cycle to maintain the airtightness. Therefore, with the simple arrangement of the entire device capable of performing satisfactory measurement, an inexpensive and compact measurement image sensor suitable for spectrum analysis and allowing relatively long-time exposure can be provided.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No. 182764/1993 filed on Jul. 23, 1993 is hereby incorporated by reference.

What is claimed is:

1. A solid state imaging device comprising:
   a package including:
      a package main body,
      a light receiving glass plate through which light passes,
      a buffer member fixed to said light receiving glass plate and said package main body, said buffer member having a thermal expansion coefficient substantially equal to that of said light receiving glass plate;
   a semiconductor chip arranged in said package and facing said glass plate, said semiconductor chip including:
      a semiconductor substrate,
      a first temperature sensor formed in a first region of said semiconductor substrate, for detecting the temperature of said semiconductor chip;
      an image sensor formed in a second region of said semiconductor substrate, for receiving the light passing through said glass plate to convert the light into video signals;
   an electronic cooling element disposed in said package and fixed to said package, said electronic cooling element including:
      a cool portion facing said semiconductor chip, for cooling said semiconductor chip, and
      a hot portion for generating heat;
   a heat radiation member for radiating the heat received from said hot portion, being fixed to said package and said hot portion;
   a second temperature sensor fixed to said heat radiation member, for detecting the temperature of said hot portion;
   an OP amplifier electrically connected to said first temperature sensor; and
   a temperature control circuit electrically connected to said OP amplifier and said electronic cooling element, wherein said temperature control circuit controls a current fed to said electronic cooling element.

2. A solid-state imaging device according to claim 1, wherein said second temperature sensor is electrically connected to said temperature control circuit.

* * * * *